United States Patent
Lee

(10) Patent No.: US 7,323,404 B2
(45) Date of Patent: Jan. 29, 2008

(54) FIELD EFFECT TRANSISTOR AND METHOD OF MANUFACTURING THE SAME

(75) Inventor: Jung-Sok Lee, Gyeongsangbuk-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 11/069,945

(22) Filed: Mar. 3, 2005

(65) Prior Publication Data

US 2005/0205945 A1    Sep. 22, 2005

(30) Foreign Application Priority Data

Mar. 18, 2004  (KR) .................... 10-2004-0018428

(51) Int. Cl.
*H01L 21/336* (2006.01)
*H01L 21/4763* (2006.01)

(52) U.S. Cl. ................ 438/589; 438/289; 438/294

(58) Field of Classification Search ........ 438/267–282, 438/294–307, 589, 289
See application file for complete search history.

(56) References Cited

U.S. PATENT DOCUMENTS

| 4,353,083 | A  | * | 10/1982 | Trudel et al. ............... 257/326 |
| 5,675,164 | A  | * | 10/1997 | Brunner et al. ............. 257/331 |
| 6,849,518 | B2 | * | 2/2005  | Parat et al. ................. 438/424 |
| 6,869,848 | B2 | * | 3/2005  | Kwak .......................... 438/289 |
| 2002/0089019 | A1 | * | 7/2002 | Fu ............................... 257/374 |
| 2004/0072412 | A1 | * | 4/2004 | Kim ............................ 438/589 |

* cited by examiner

*Primary Examiner*—Cuong Nguyen
(74) *Attorney, Agent, or Firm*—Volentine & Whitt, PLLC

(57) ABSTRACT

A field effect transistor (FET) and related manufacturing method are disclosed, wherein an active region of a semiconductor substrate is embossed by a first trench structure. A second trench structure and filling shallow trench insulator laterally defines the active region. Sidewalls of the trenches forming the first trench structure descend to a bottom face with a positive sloped, such that the intersection of the respective sidewalls with the bottom face form an obtuse angle.

21 Claims, 19 Drawing Sheets

FIELD EFFECT TRANSISTOR AND METHOD OF MANUFACTURING THE SAME

BACKGROUND

1. Field of the Invention

The invention relates generally to semiconductor devices and related methods of manufacture. More particularly, the invention relates to a field effect transistor and method for manufacturing the same.

A claim of priority is made to Korean Patent application 2004-18428 filed Mar. 18, 2004, the subject matter of which is hereby incorporated by reference.

2. Description of the Related Art

Contemporary semiconductor devices are characterized in one regard by high integration densities. Accordingly, various methods have been proposed to reduce the physical feature size of individual devices formed on a constituent semiconductor substrate while at the same time maintaining the functional performance characteristics of the devices. Some of these conventional methods have been applied to the formation of field effect transistors (FETs) which are common devices apparent in Complementary Metal Oxide Semiconductor (CMOS) circuits and devices.

Unfortunately, continued reduction in the size of FETs poses some real problems. For example, the formation of a planar structure FET on a contemporary single-crystal silicon substrate with a gate electrode having a length less than 500 Å is particularly sensitive to variations in process conditions. Accordingly, it is difficult to control the performance characteristics of the resulting FET. As a result, various conventional attempts have been made to control the performance of FETs. U.S. Pat. No. 5,675,164, for example, proposes increasing a channel width of the gate electrode instead of a channel length in order to stabilize FET performance over variations in process conditions.

FIGS. 1a and 1b are related plan and sectional views illustrating the structure of a conventional FET. In the conventional FET, an active region "AA" under a gate electrode has a structure comprising numerous mesa-like structures (hereafter "mesas") 11, each having a width of under a micron. This arrangement has the effect of increasing the effective channel width of the device.

A manufacturing method adapted to produce this conventional FET structure will now be described.

First, a silicon oxide layer having a predetermined thickness is formed on a semiconductor substrate. A photoresist is then deposited on the silicon oxide layer and patterned using a photolithography process and a related mask having a desired line pattern with a sub micron pitch.

Subsequently, the silicon oxide layer is selectively removed by using the photoresist as an etch mask.

Next, the semiconductor substrate is etched to a predetermined depth using the silicon oxide layer as an etch mask, such that grooves are selectively formed to yield the mesas 11. Groove depth is determined in proportion to the pattern pitch of the silicon oxide layer and in relation to a desired width for the mesas. The groove forming the mesas is formed with a high aspect ratio defined by the vertical intersection of the groove's sidewall with the bottom face of the groove. However, in cases where the intersection of the sidewall and bottom is formed at a negative angle smaller than 90°, performance of the FET is diminished. Accordingly, a silicon oxide layer of predetermined thickness is generally formed on the bottom face of groove using, for example, a liquid phase deposition to remedy this potential problem.

Following this remedial step, a gate insulation layer (not shown) of predetermined thickness is formed on an active region of the resulting structure including the mesas.

A gate electrode and an upper gate insulation layer are then formed on a gate region of the active region on which the gate insulation layer was formed. A low density of impurity having a predetermined conductivity type is ion implanted in the source (S) and drain (D) regions using the gate electrode as an ion implantation mask, thereby forming a first impurity region.

A spacer is then formed on a sidewall of the gate electrode, and a high density of impurity is ion implanted in the source/drain regions by using the spacer and gate upper insulation layer as an ion implantation mask, thereby forming a second impurity region. Then, a pad polysilicon layer is formed on the second impurity region.

The foregoing conventional FET manufacturing method can increase the effective channel width by means of grooves forming multiple mesas in the gate region. However, the conventional FET and related manufacturing method are not without distinct disadvantages.

For example, as noted above with respect to the conventional FET manufacturing method, mesas 11 and the gate electrode are formed from polysilicon. It is difficult to accurately reproduce in polysilicon the desired corner flute of the mesas. Namely the desired right-angle intersection between the sidewall and bottom of the groove is difficult to achieve. Rather, a negative angle is often produced and performance of the FET suffers accordingly.

Additionally, it is difficult to accurately and reproducibly remove portions of the polysilicon layer so as to form the corner flute of the mesas formed on a source/drain region, such that the polysilicon layer forming the gate electrode is impaired and reliability of the FET suffers.

Additionally, as noted above, the additional formation of a silicon oxide layer over the bottom faces of the groove forming the mesas is required in order to prevent polysilicon layer defects generated in the corner flutes of the mesa structure from adversely defining the angle of intersection between the sidewall and bottom face of the grove. As a result, the bottom face of the groove cannot be used as a channel, thus lowering performance of the FET.

SUMMARY OF THE INVENTION

Accordingly, it would be desirable to provide a FET and related manufacturing method characterized by increased reliability brought about by a more accurate and reproducible formation of a polysilicon layer in relation to a (mesa forming) trench structure formed on an active region of a semiconductor substrate. Further, device reliability would be further enhanced by the complete and reproducible removal of polysilicon from the source and drain regions of the active region. Finally, an FET comprising a trench structure wherein the bottom face portions of the trench structure effectively formed part of a constituent gate channel would also improve device performance.

Accordingly, one embodiment of the invention provides a method of manufacturing a field effect transistor (FET), comprising; forming a first trench structure in an active region of a semiconductor substrate, forming a second trench structure to laterally define the active region, forming a shallow trench insulator within the second trench structure, forming a gate insulation layer on the active region, forming a gate electrode structure on the gate insulation layer, and ion implanting an impurity of first conductivity type in source and drain regions of the active region using the gate electrode structure as an ion implantation mask to thereby form a first impurity region.

In a related aspect, the formation of the first trench structure comprises; sequentially forming a pad oxide layer and a hard mask layer on the semiconductor substrate, patterning the hard mask layer and the pad oxide layer using a photolithography process, and selectively removing to a predetermined depth portions of the semiconductor substrate using the hard mask layer and the pad oxide layer as an etch mask to thereby form a plurality of trenches.

In another related aspect, the formation of the shallow trench insulator comprises; forming a silicon oxide layer over the first and second trench structures to form the shallow trench insulator, and removing a portion of the shallow trench insulator formed on the first trench structure.

In another embodiment, the invention provides a method of manufacturing a field effect transistor (FET), comprising; sequentially forming and patterning a pad oxide layer and a hard mask layer on a semiconductor substrate, selectively removing portions of the semiconductor substrate using the patterned pad oxide layer and hard mask layer as an etch mask to thereby form a first trench structure comprising a plurality of trenches and providing an embossing profile to the semiconductor substrate, forming a second trench structure laterally defining an active region in the semiconductor substrate comprising the first trench structure, forming a shallow trench insulator within the second trench structure, forming a gate insulation layer on the active region, forming a gate electrode structure on a gate region of the active region, and ion implanting a first conductivity type impurity in source and drain regions of the active region using the gate electrode structure as an ion implantation mask to thereby form a first impurity region.

In yet another embodiment, the invention provides a field effect transistor (FET), comprising; an active region laterally defined by a shallow trench insulator formed in a semiconductor substrate, a first trench structure formed in the active region and providing an embossing profile, a gate insulation layer formed on the active region, a gate electrode structure formed on a gate region of the active region and on the gate insulation layer, and a first impurity region formed by ion implanting a conductive impurity in source and drain regions of the active region by using the gate electrode structure as an ion implantation mask.

In a related aspect, the first trench structure comprises a plurality of trenches, each trench having sidewalls descending to a bottom face, the sidewalls being positively sloped such that the intersection of the respective sidewalls with the bottom face form an obtuse angle.

BRIEF DESCRIPTION OF THE DRAWINGS

The invention is described in the context of several exemplary embodiments hereafter with reference to the accompanying drawings in which.

DESCRIPTION OF THE EXEMPLARY EMBODIMENTS

Hereinafter, exemplary embodiments of the present invention will be described in detail with reference to FIGS. 2 to 4. It will be understood by those of ordinary skill in the art that the invention may be implemented in numerous embodiments. The embodiments presented here are exemplary in nature.

Figure 1A:
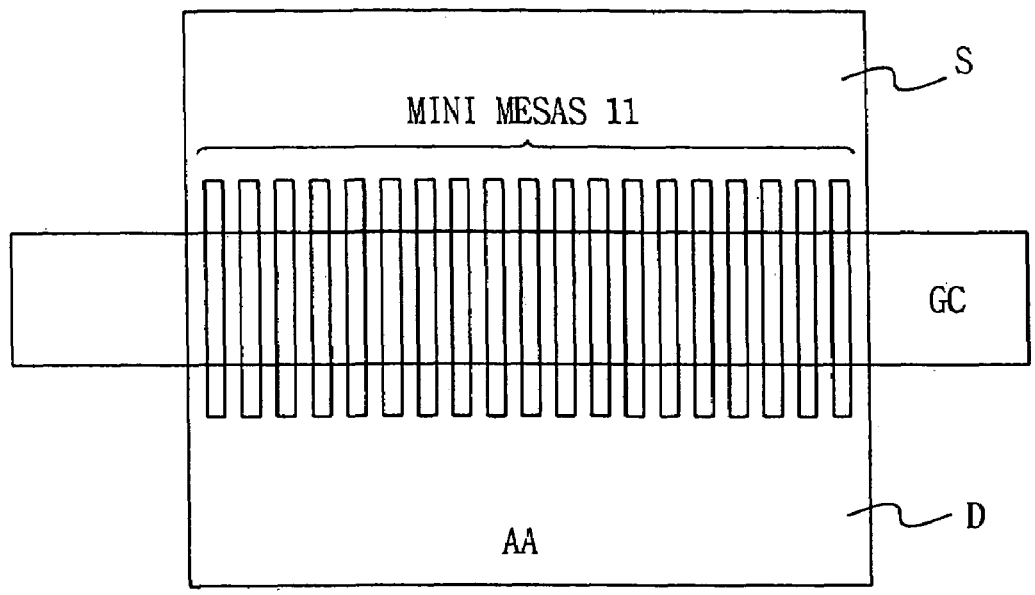
FIGS. 1a and 1b are related plan and sectional views illustrating the structure of a conventional FET.
Figure 1B:
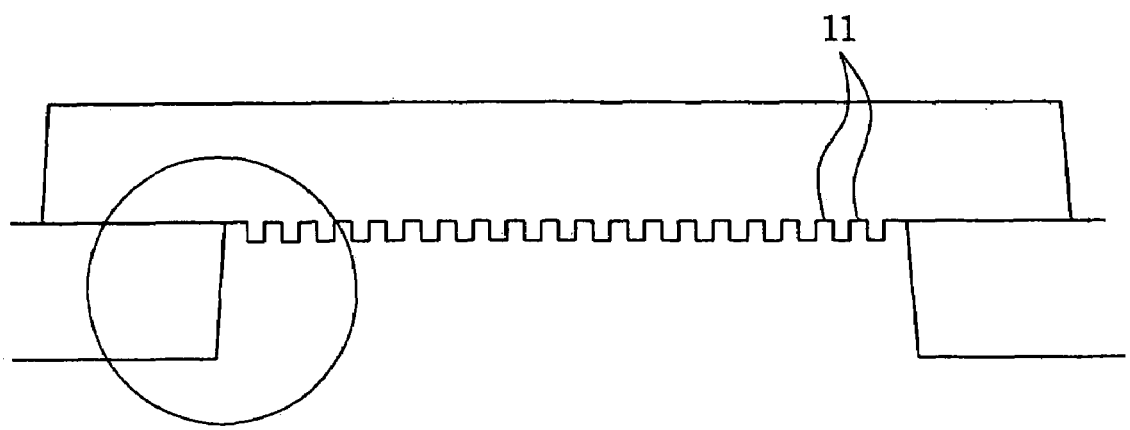
Figure 2:
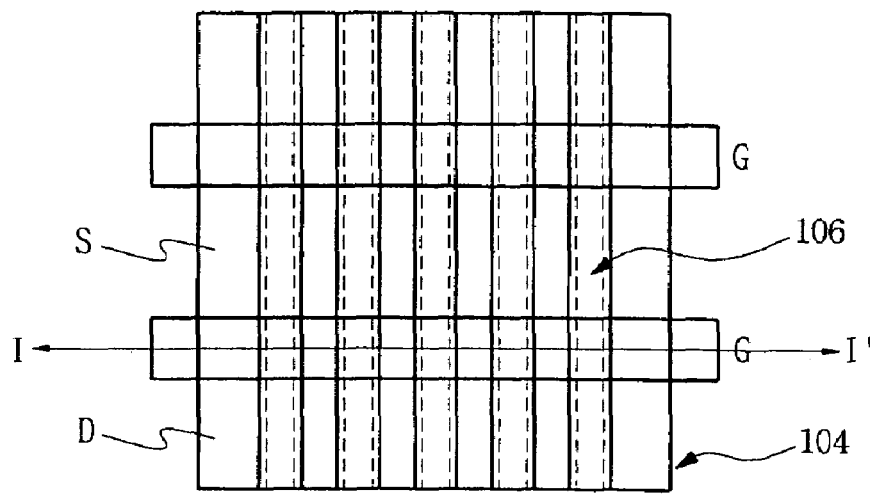
FIG. 2 is a plan view schematically illustrating a FET according to one exemplary embodiment of the invention.

FIG. 2 is a plan view schematically illustrating a FET according to one exemplary embodiment of the invention. FIG. 3 is a related sectional view taken along line I~I' of FIG. 2.

Figure 3:
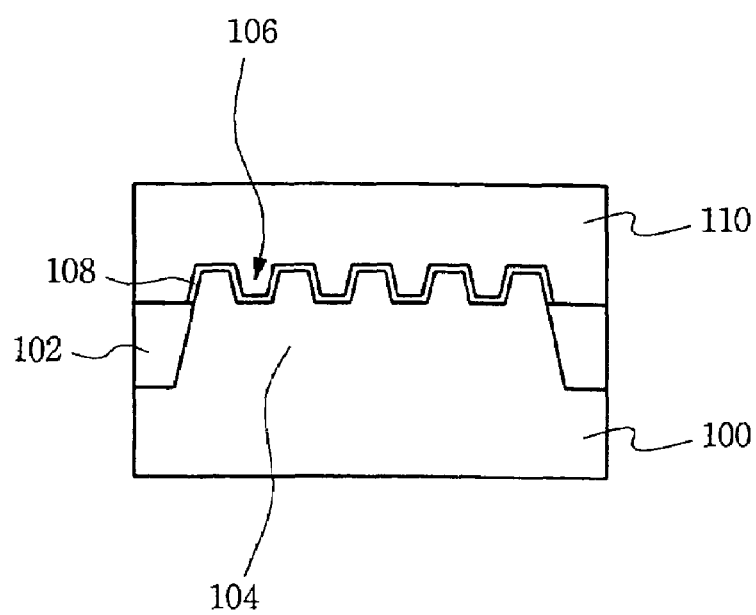
FIG. 3 is a sectional view taken along line I~I' of FIG. 2.

Referring to FIGS. 2 and 3, a field effect transistor (FET) according to an exemplary embodiment of the invention includes an active region 104 defined by a shallow trench insulator 102 formed on a semiconductor (preferably a single crystal silicon) substrate 100, a plurality of first trenches (hereafter the "first trench structure") 106 which are formed in parallel in one direction so as to obtain an embossing profile of active region 104, a gate insulation layer 108 formed on active region 104, and a gate electrode 110 formed on a gate region (G) of active region 104 on which the gate insulation layer 108 was formed.

The FET further includes a first impurity region formed by ion implanting a conductive impurity in source (S) and drain (D) regions on opposite sides of gate region (G) under gate electrode 110.

First trench structure 106 is formed on an upper surface of active region 104 which is defined on either lateral side by a shallow trench insulator 102. Each shallow trench insulator 102 is formed within a second trench structure 116 (of FIG. 4f) that is formed by etching to a predetermined depth the semiconductor substrate 100 adjacent to active region 104.

First trench structure 106 is further formed such that sidewalls of the constituent plurality of trenches descend to a bottom face and are positively sloped, such that the exposed bottom face is smaller than a corresponding upper opening for each respective constituent trench. For example, the resulting angle of intersection between respective sidewalls and the bottom face resulting in sidewall slopes ranging between about 30° to about 80°. Such a structure results in an embossing profile of sorts. In other words, each constituent trench within first trench structure 106 is formed with sidewalls intersecting the bottom face at an obtuse angle greater than 90°.

Sidewalls and bottom faces of the first trench structure are thus formed in contact with gate electrode 110 through gate insulating layer 108.

This structure tends to remediate the defects apparent in the conventional FET structure wherein the gate electrode meets the trench structure at corner flute. Thus, the invention provides a FET having improved reliability.

A related method of manufacturing method for the foregoing FET will now be described with reference to FIGS. 4a through 4q which illustrate one exemplary embodiment of the invention.

Figure 4A:
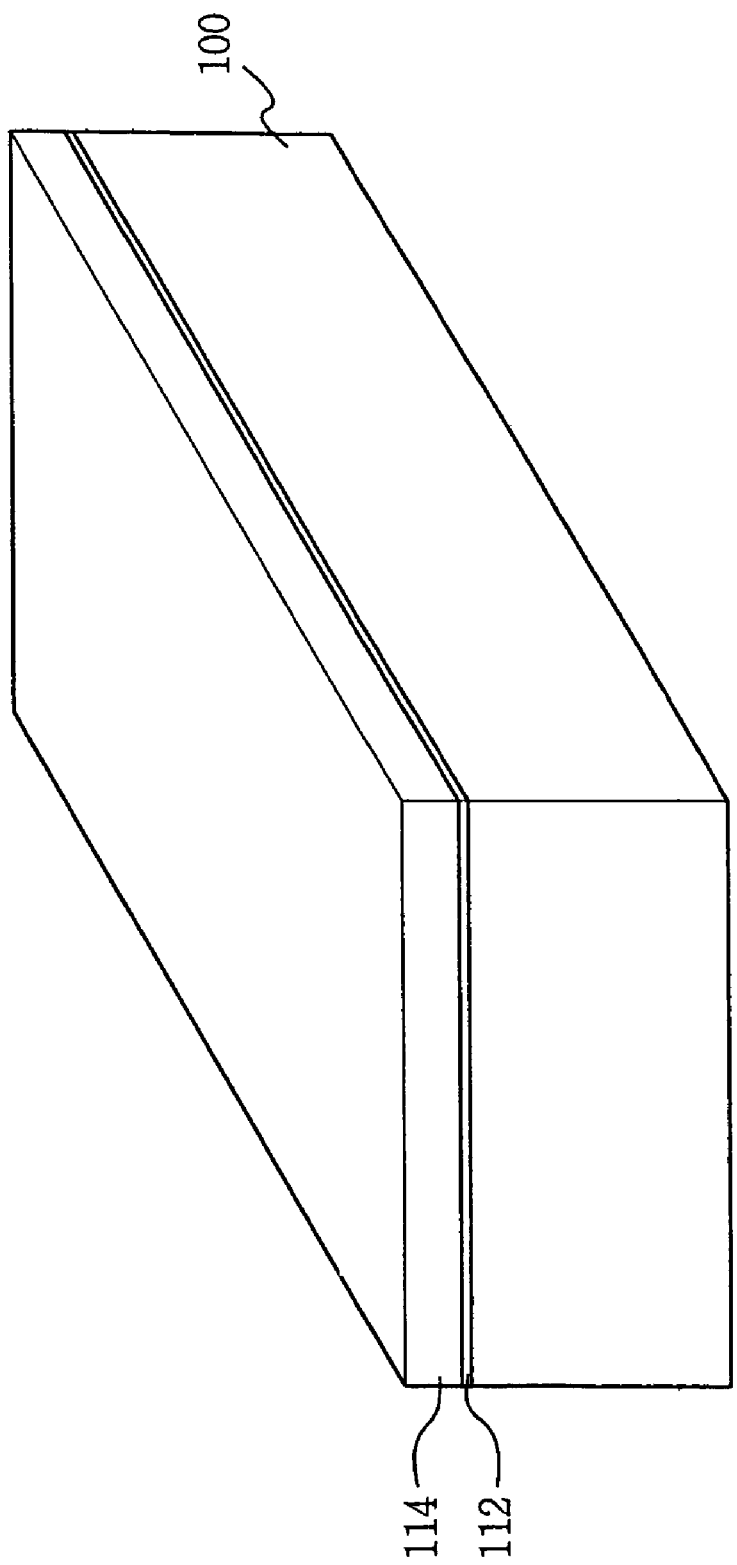
FIGS. 4a to 4q are perspective views illustrating a manufacturing method for a FET according to one exemplary embodiment of the invention.

As shown in FIG. 4a, a pad oxide layer 112 and a hard mask layer 114 are sequentially formed on semiconductor substrate 100 using, for example, a chemical vapor deposition process. Pad oxide layer 112 may be formed from a silicon oxide layer, and hard mask layer 114 may be formed from a silicon nitride layer or a silicon oxide nitride layer.

In the illustrated embodiment, hard mask layer 114 is not formed in direct contact with the upper surface of semiconductor substrate 100, because lattice defects caused by dangling bonds in the semiconductor substrate 100 would result. Accordingly, pad oxide layer 112 is preferably formed between semiconductor substrate 100 and hard mask layer 114.

Pad oxide layer 112 may be formed, for example, with a predetermined thickness ranging from about 300 Å to about 1000 Å using a Medium Temperature Oxide (MTO) process. Hard mask layer 114 may be formed, for example, with a thickness ranging between about 500 Å to about 1000 Å using a chemical vapor deposition (CVD) process.

Figure 4B:
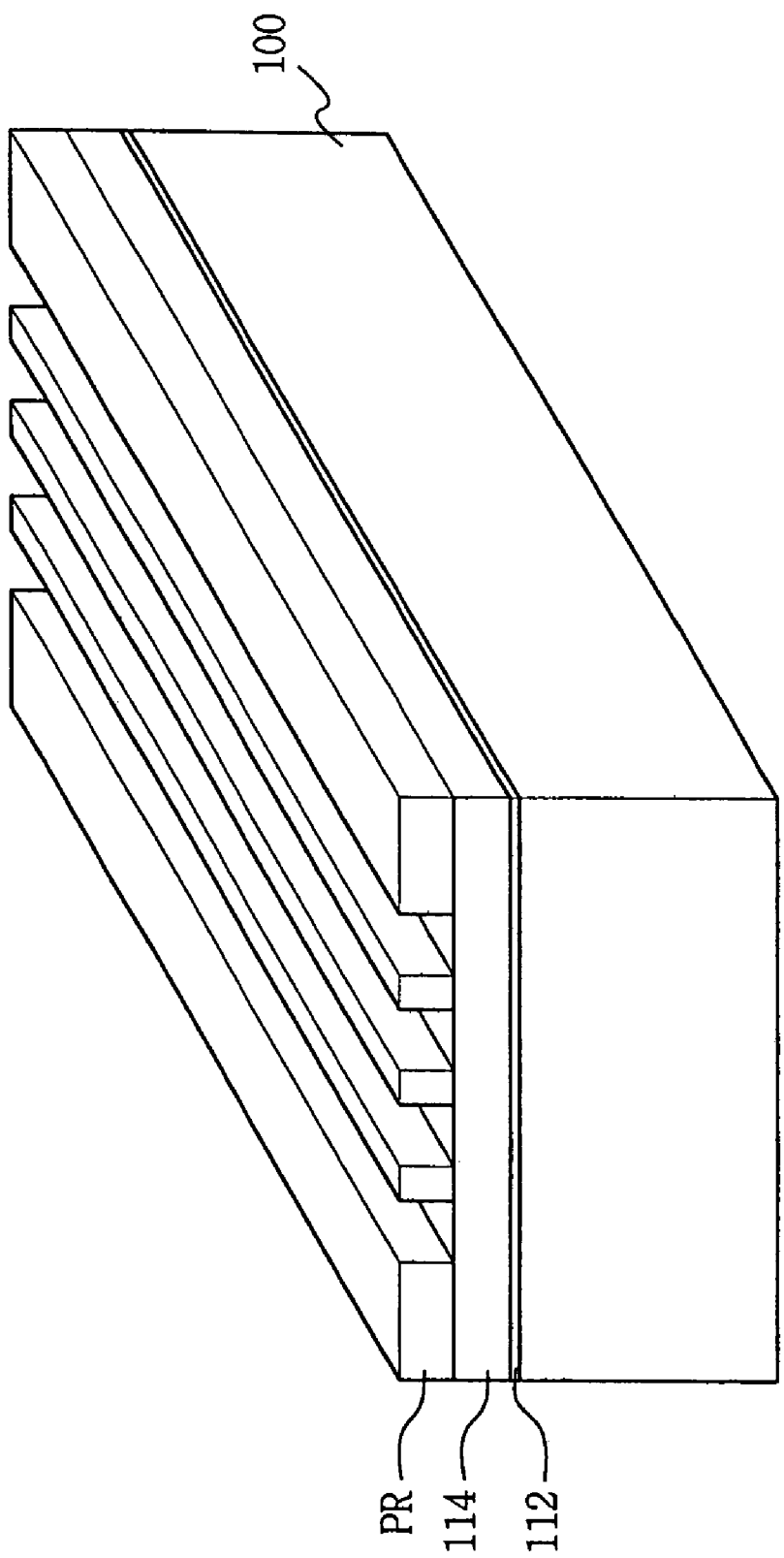

As shown in FIG. 4b, a first photoresist (PR) is deposited on the resulting structure, and is then selectively exposed and developed using a conventional photolithography process. During the exposure process, a photomask is aligned on the photoresist, selectively exposed to ultraviolet rays, and then developed in order to pattern the photoresist layer. A range of ultraviolet rays may be used for this process, including ultraviolet rays generated by a light source having a wavelength of 436 nm, (e.g., G-line), a wavelength of 365 nm, (e.g., i-line), a wavelength of 245-252 nm, (e.g., DUV), a wavelength of 248 nm, (e.g., KrF excimer laser), a wavelength of 193 nm, (e.g., ArF excimer layer), and/or a wavelength under 100 nm, (e.g., an X-ray, E-beam, or ion beam). The chemical composition of photoresist will vary in relation to the selected exposing light source. Among the range of potential light sources, a light source having a wavelength under 248 nm, (e.g., KrF excimer laser, ArF excimer laser, X-ray, E-beam, or ion beam) may prove particularly beneficial in the context of the invention.

In one related aspect, where hard mask layer 114 is formed from a dielectric layer such as silicon oxide nitride having a high transmittance exposure defects may result. In such circumstance an anti-reflective coating may be formed on hard mask layer 114 before the photoresist layer is deposited.

Figure 4C:
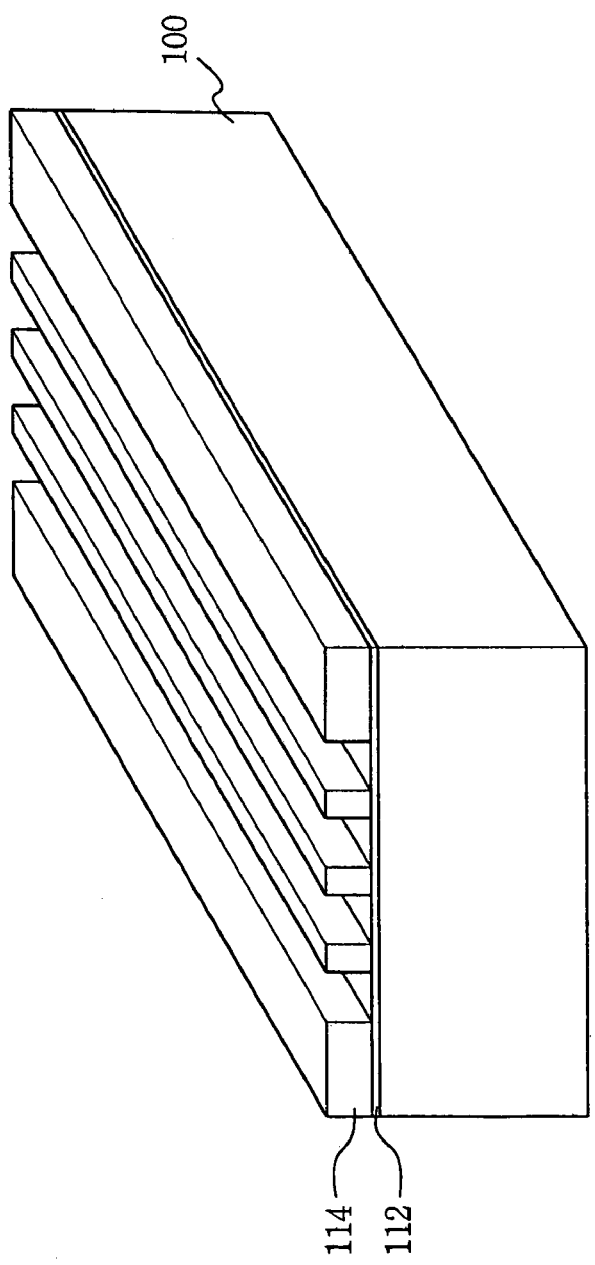

As shown in FIG. 4c, selected portions of hard mask layer 114 are removed using the patterned photoresist as an etch mask. Thereafter, the patterned photoresist is cleaned away. Etching of hard mask layer 114 may be performed using a dry etching having a prominent anisotropy and validity. During the etching of hard mask layer 114, pad oxide layer 112 serves as an etch stopper.

Figure 4D:
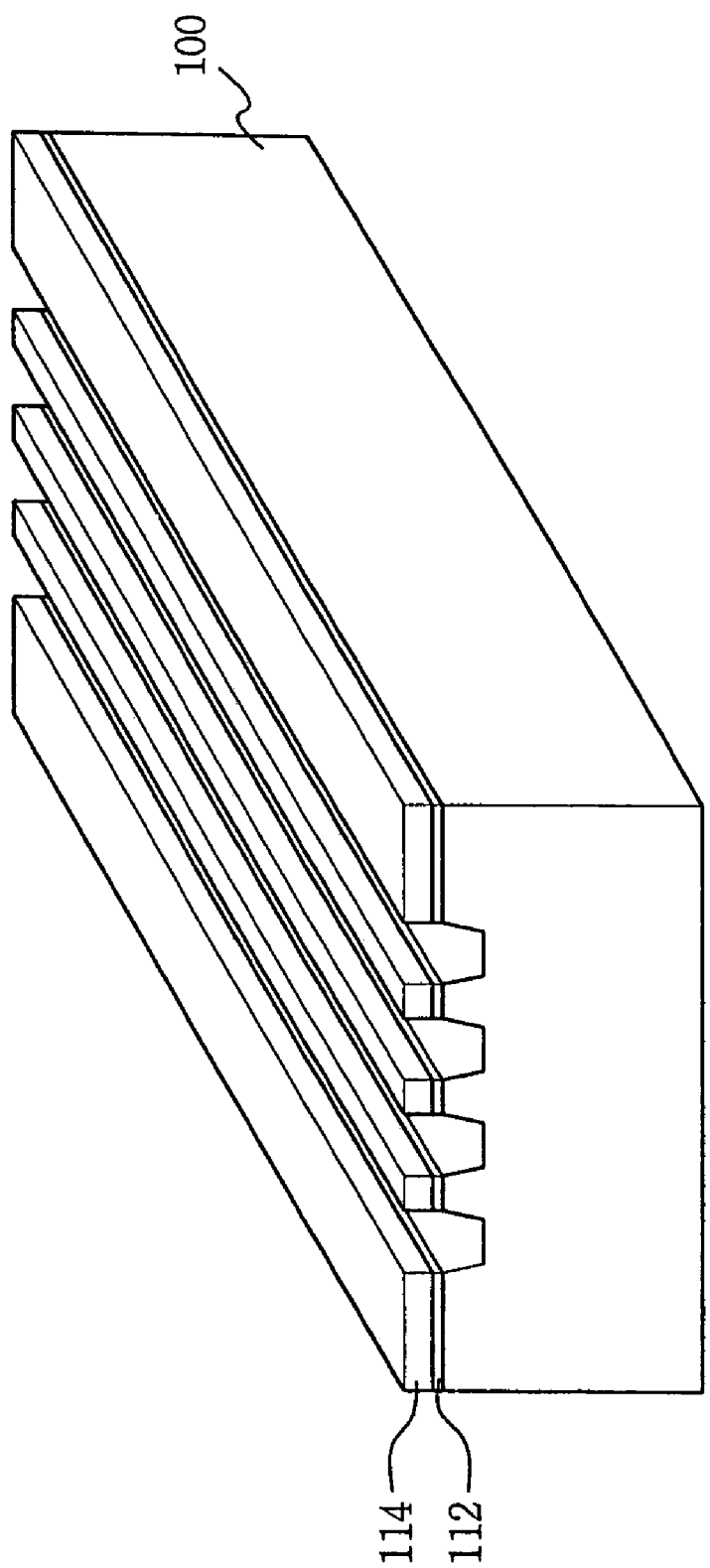

With reference to FIG. 4d, portions of pad oxide layer 112 are next removed using the hard mask layer 114 as an etch mask to expose portions of semiconductor substrate 100. In some additional detail, pad oxide layer 112 may be etched using a conventional process referred to as a Break-Through (BT) process which is normally performed as a dry etching. The etching of pad oxide layer 112 uses the surface of semiconductor substrate 100 as an etch stopper.

Thereafter, exposed portions of semiconductor substrate 100 are removed (e.g. etched) to a predetermined depth in order to form the plurality of trenches of first trench structure 106. This selectively etching of semiconductor substrate 100 may be performed using hard mask layer 114 and pad oxide layer 112 as an etch mask.

The process of etching semiconductor substrate 100 and thereby forming the first trench structure 106 will be referred to hereafter as a Main Etching (ME) process. Both the BT and ME processes may be executed in situ in a single reaction chamber. That is, the ME process may be performed as a dry etching like the BT process. As is known in the art, dry etching may be used to sequentially etch multiple layers formed by different materials by providing in sequence different kinds of reactive gases which have different etch rates in relation to the different materials. For example, the foregoing BT process may use $CF_4$ reactive gas which has an etch selection rate relative to the pad oxide layer as compared with the semiconductor substrate 100. Within this example, the BT process may be performed as a time etching method at pressure of about 3 mTorr and energy of about 400 W.

The ME process may use HBr, $Cl_2$ and $HeO_2$(flow 90:10:12) as reactive gases and the process may be performed as a time etching method at pressure of about 0.1 mTorr and energy of about 300 W. In the ME process, it should be noted that the etching rate for semiconductor substrate 100 by this combination of reactive gases will changed with temperature. Accordingly in one embodiment, the process chamber temperature will range from about 87° C. to about 40° C.

A combination of the foregoing exemplary process conditions and techniques will result in the formation of a first trench structure 106 in active region 104 with a depth of about 100 Å to about 1000 Å. The respective sidewalls of first trench structure 106 descend evenly to a corresponding bottom face with a slope of about 30° to about 80°.

Hence, in forming the first trench structure 106 using dry etching steps enabled by properly selected reactive gas(es) and predetermined conditions, the desired obtuse angle, as measured from the plane of the bottom face to the plane of an intersecting sidewall, may be obtain for the plurality of trenches forming the first trench structure 106.

Figure 4E:
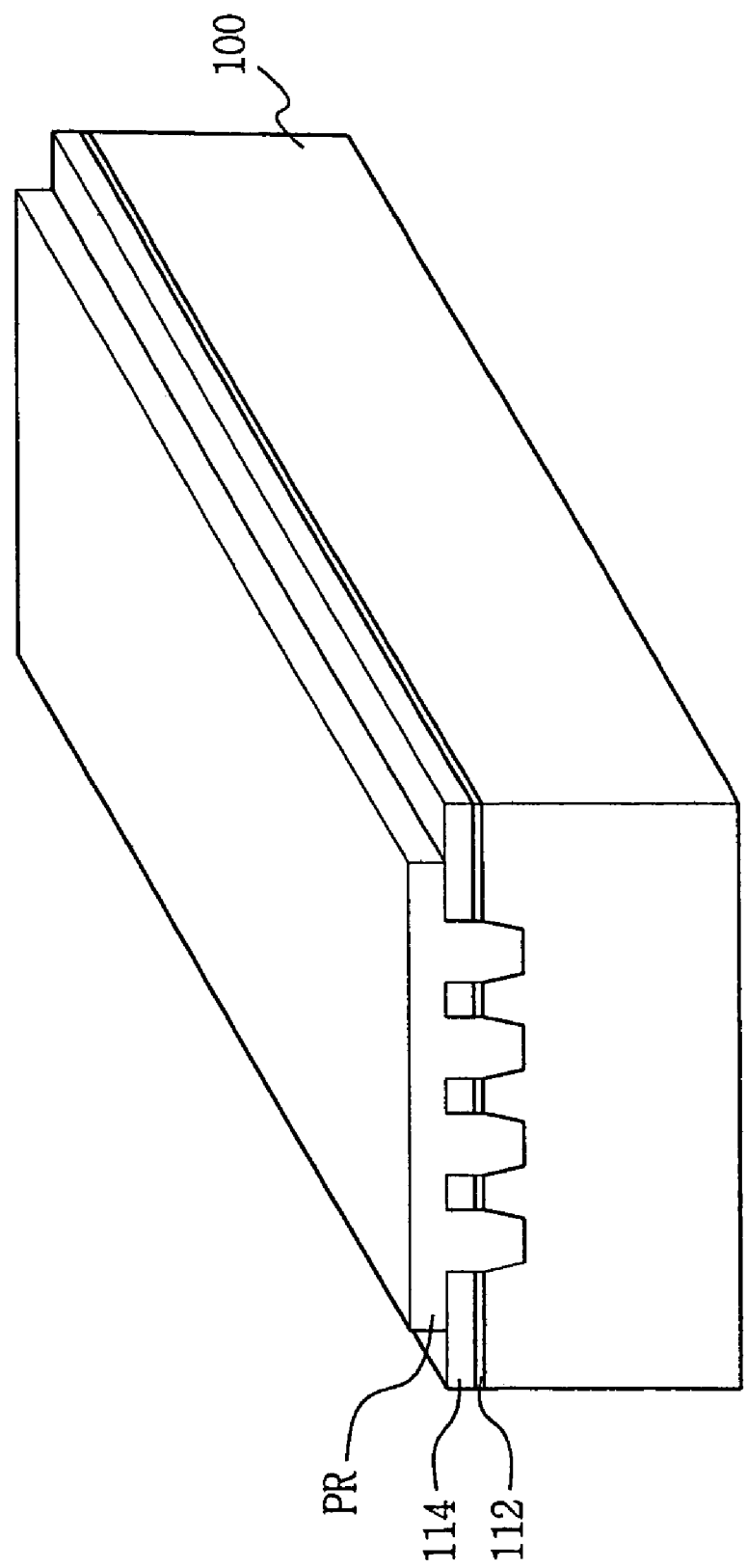

As shown in FIG. 4e, a second photoresist (PR) is next deposited on the resulting structure, namely over semiconductor substrate 100 having first trench structures 106 formed therein. The second photoresist is then patterned using a conventional photolithography process. The photolithography process used to expose the second photoresist may use a light source wavelength under 365 nm, (e.g., i-line, DUV, KrF excimer laser, ArF excimer laser, X-ray, E-beam or ion beam). Once patterned, the second photoresist defines (e.g., covers) active region 104.

Figure 4F:
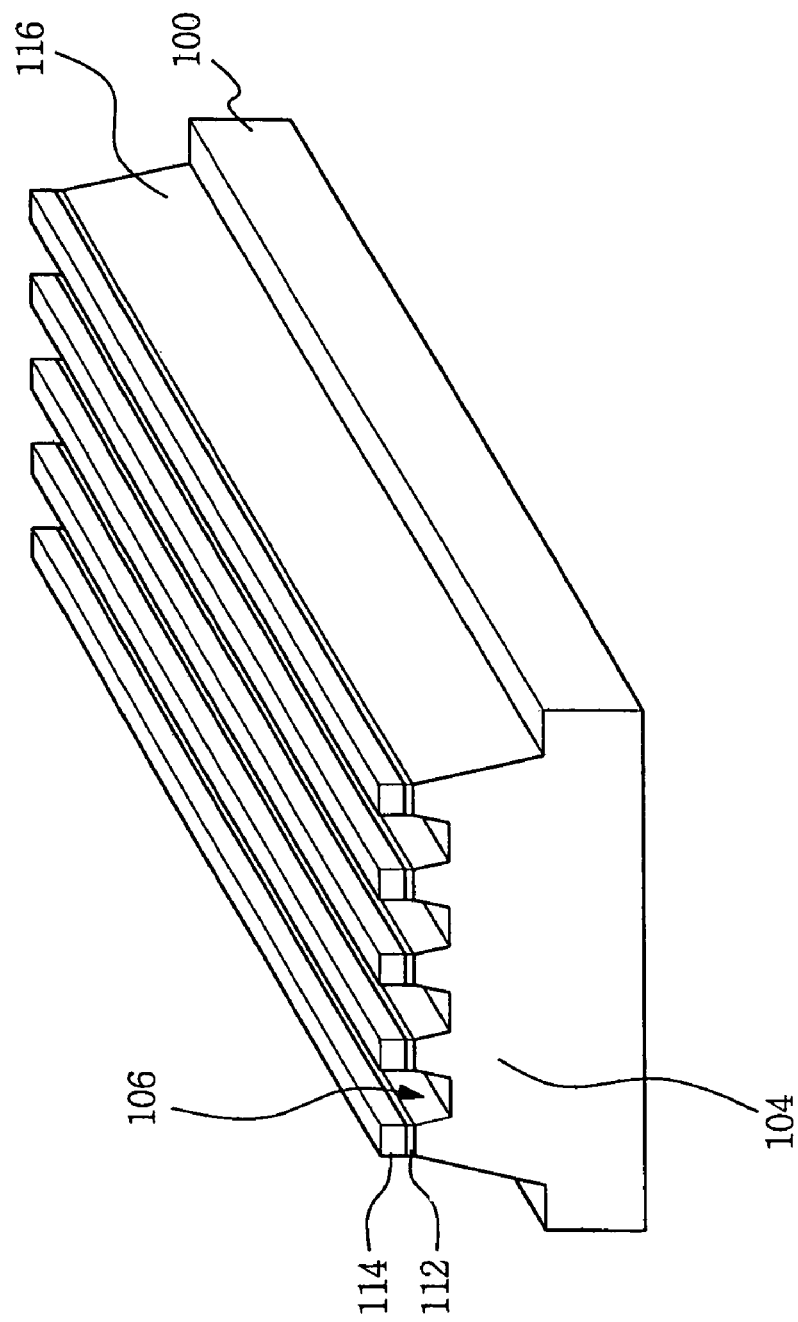

Referring now to FIG. 4f, side portions of semiconductor substrate 100 are removed to a predetermined depth using a dry etching process and the second photoresist as an etch mask, thereby forming second trench structure 116. The foregoing dry etching process may use, for example, $CF_4$: $O_2$(flow 60:150) as a reactive gas. Second trench structure 116 may be formed to a depth of about 2000 Å to about 3000 Å or greater.

Figure 4G:
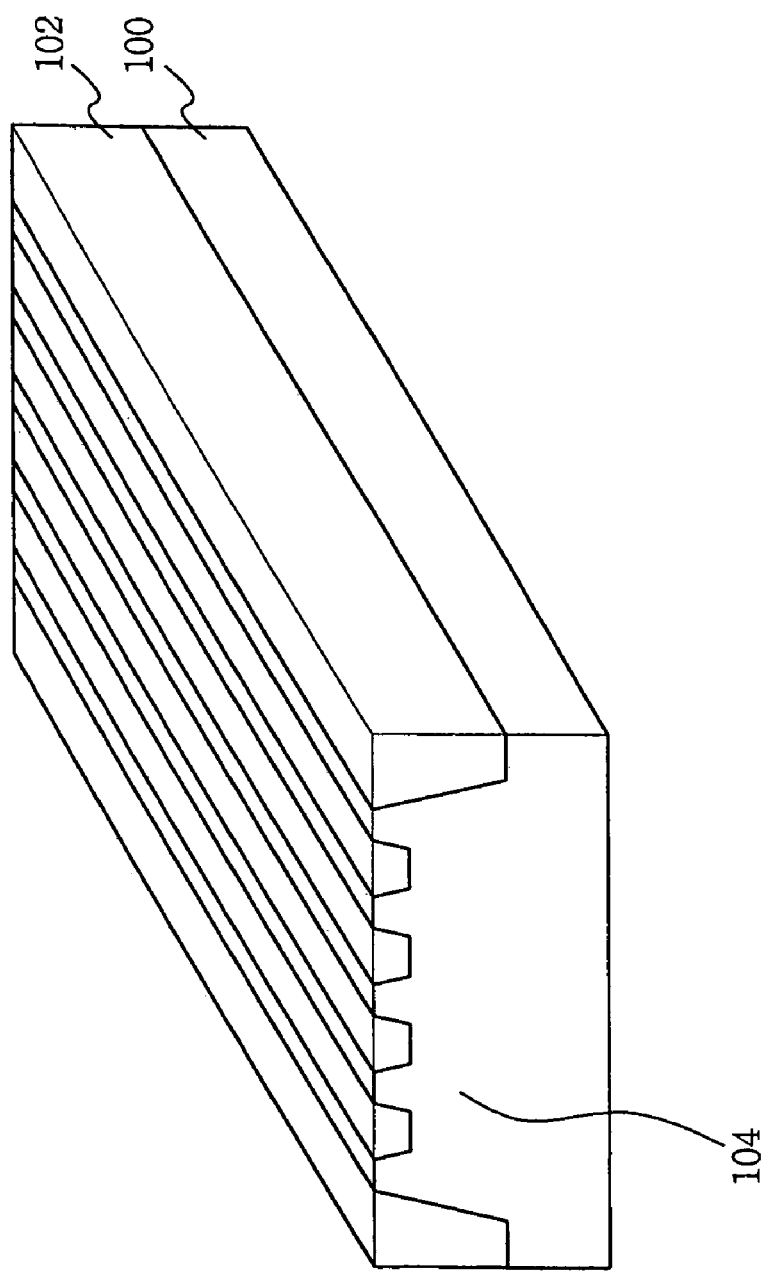

Referring now to FIG. 4g, a silicon oxide layer having a predetermined thickness is formed on the resulting structure including the second trench structure 116. Thereafter, the silicon oxide layer, hard mask layer 114 and pad oxide layer 112 are evenly (planarly) removed until the surface of active region 104 is exposed. The planar removal of these layers may be accomplished using, for example, a chemical mechanical polishing or etch-back process. The resulting residual portions of the silicon oxide layer forming a shallow trench insulator 102 filling the first and second trench structures 106 and 116.

Alternatively, second trench structure 116 and the portion of shallow trench insulator 102 filling it may be formed separately from (e.g., prior to), the formation of first trench structure 106. However, in this case, defects resulting from the separately applied photolithography and etching processes may adversely affect the step coverage or uniformity of shallow trench insulator 102.

Figure 4H:
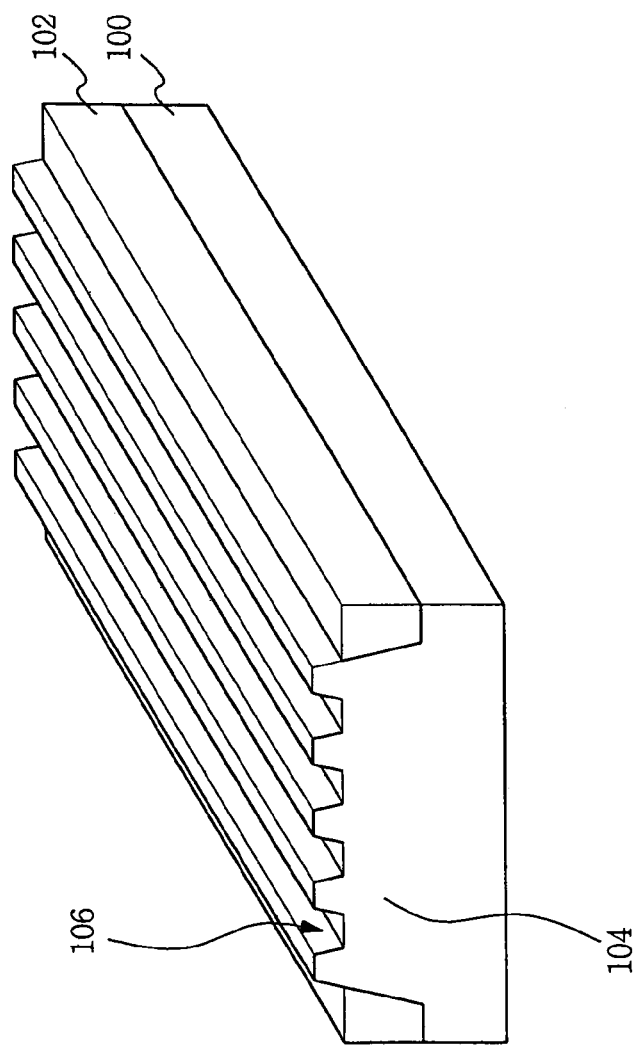

As shown in FIG. 4h, the portion of shallow trench insulator 102 filling the first trench structure 106 is removed using a wet and/or dry etching process to expose the entire face of active region 104 as defined (e.g., embossed) the first trench structure 106. In removing the portion of shallow trench insulator 102 filling the first trench structure 106, the portion of shallow trench insulator 102 filling the second trench structure 116 is also removed by a similar thickness.

Figure 4I:
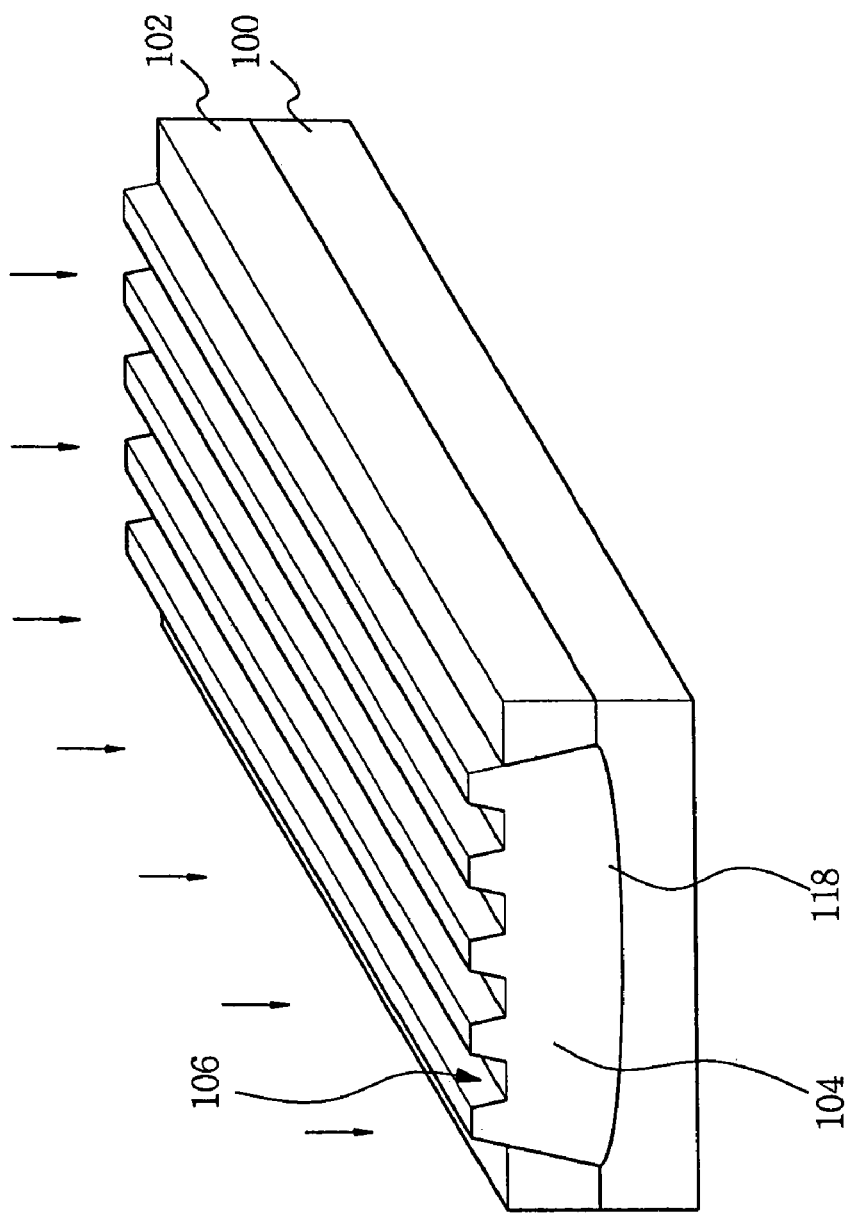

In FIG. 4i, a first conductive type impurity of a low density is ion implanted in active region 104, thus forming a channel impurity region 118. The first conductivity type impurity ion-implanted in the channel impurity region is preferably a P-type impurity such as B or $BF_2$ and is ion implanted to a concentration ranging from about $1.0 \times 10^{13}$ atoms/cm$^2$ to about $1.0 \times 10^{15}$ atoms/cm$^2$.

Figure 4J:
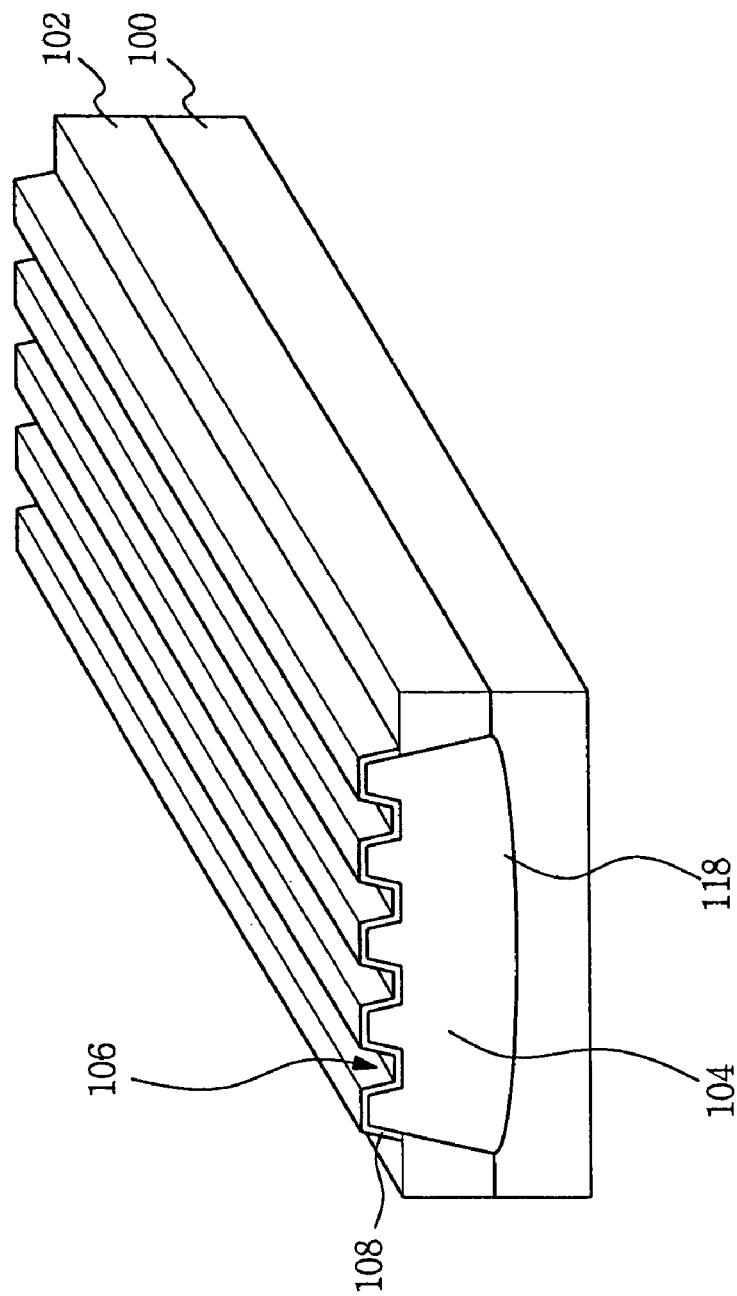

In FIG. 4j, a gate insulation layer 108 formed from a silicon oxide layer having a predetermined thickness is formed on active region 104. For example, gate insulation layer 108 may be formed with a thickness less than 200 Å using a Rapid Temperature Oxide (RTO) process.

Figure 4K:
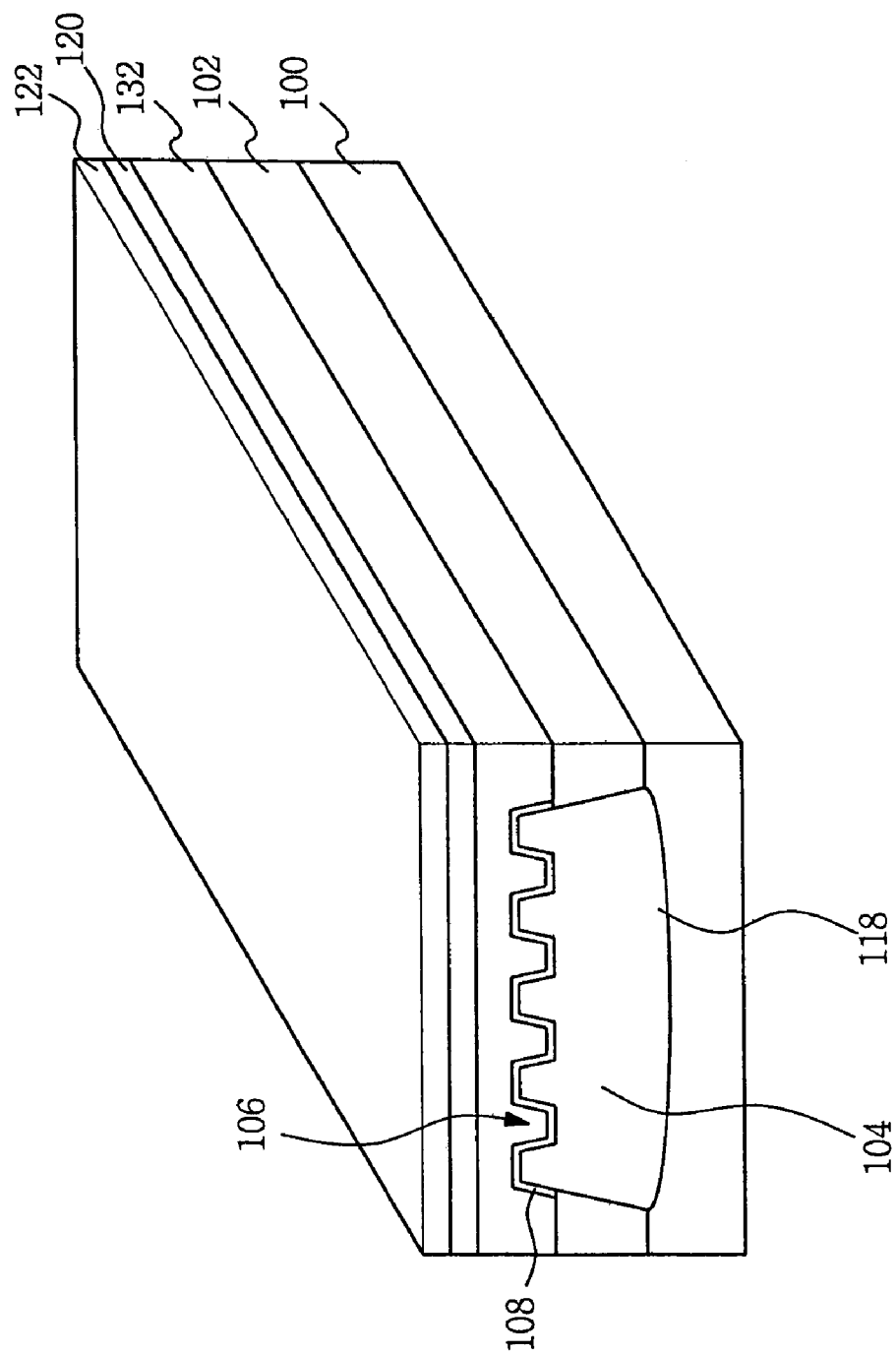
Figure 41:
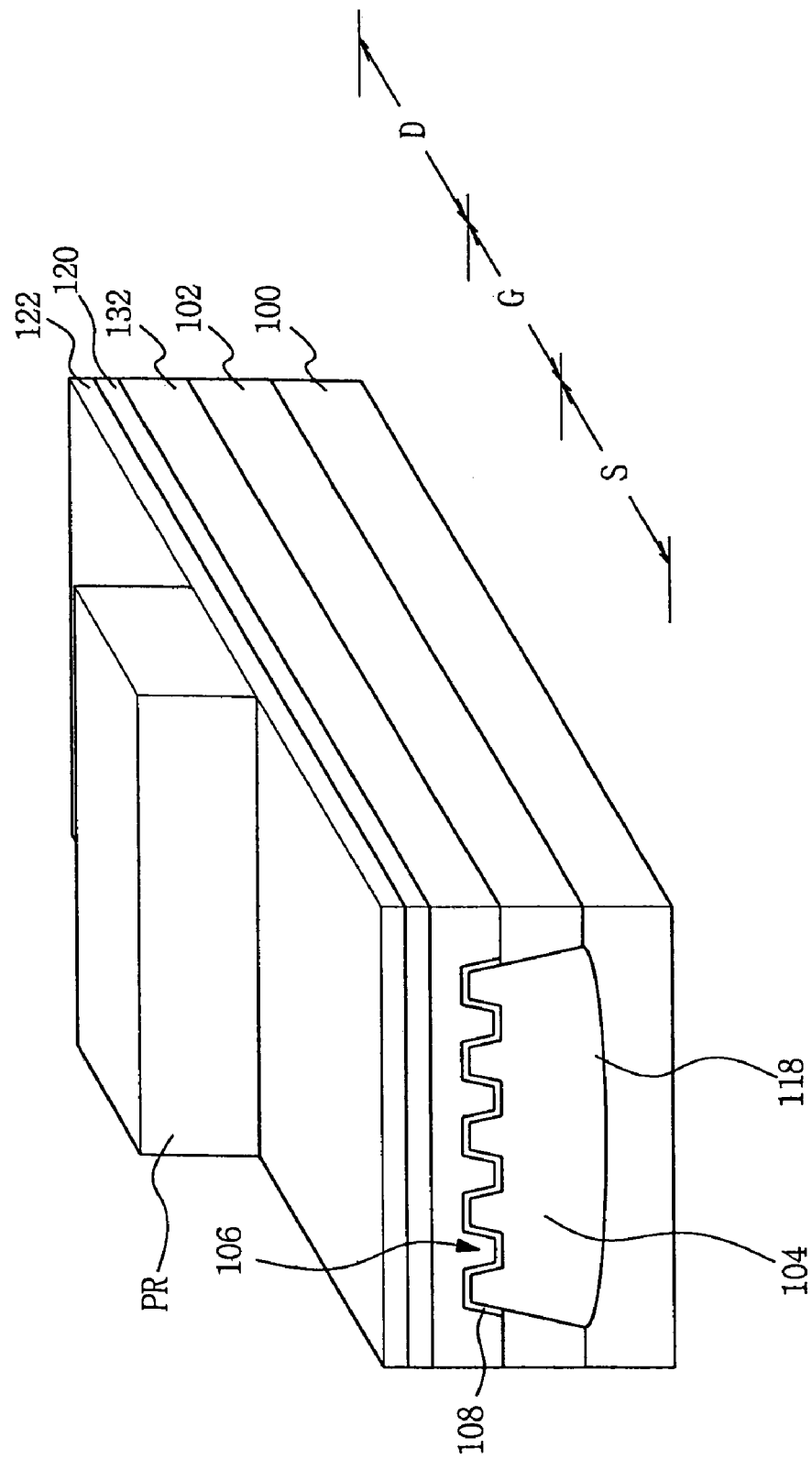

Referring to FIG. 4k, a gate electrode structure comprising, for example, a gate electrode 132 is formed on the resulting structure including gate insulation layer 108. A conductive metal layer 120 and a gate upper insulation layer 122 are then formed on gate electrode 132 to complete the gate electrode structure. Gate electrode 132 may be formed from a polysilicon layer doped with a conductive impurity using a chemical vapor deposition (CVD) process. Conductive metal layer 120 may be formed from a metal layer of aluminum, tungsten, titanium, aluminum silicide, tungsten silicide and titanium silicide, using a CVD or sputtering process. Gate upper insulation layer 122 may be formed from a silicon nitride layer using a CVD process. Of note, the polysilicon layer from which gate electrode 132 is formed is readily and reproducibly formed in the corner flutes of the first trench structure 106 such that it accurately follows the established embossing profile.

In a FET manufacturing method according to an exemplary embodiment of the invention, first trench structure 106 having an embossing profile is formed, and a gate electrode 132 can thereafter be reproducibly (e.g., with excellent fill and coverage) formed on the first trench structure 106, thereby increasing reliability of the FET.

As shown in FIG. 4l, a third photoresist (PR) is next deposited on gate upper insulation layer 122, and is then patterned using a conventional photolithography process so that a portion of the third photoresist is left over a gate region (G) of active region 104. The photolithography process used to expose the third photoresist may use a light source having a wavelength under 365 nm, (e.g., i-line, DUV, KrF excimer laser, ArF excimer laser, X-ray, E-beam or ion beam). The patterned third photoresist defines (e.g., covers) gate region (G) of active region 104.

Figure 4M:
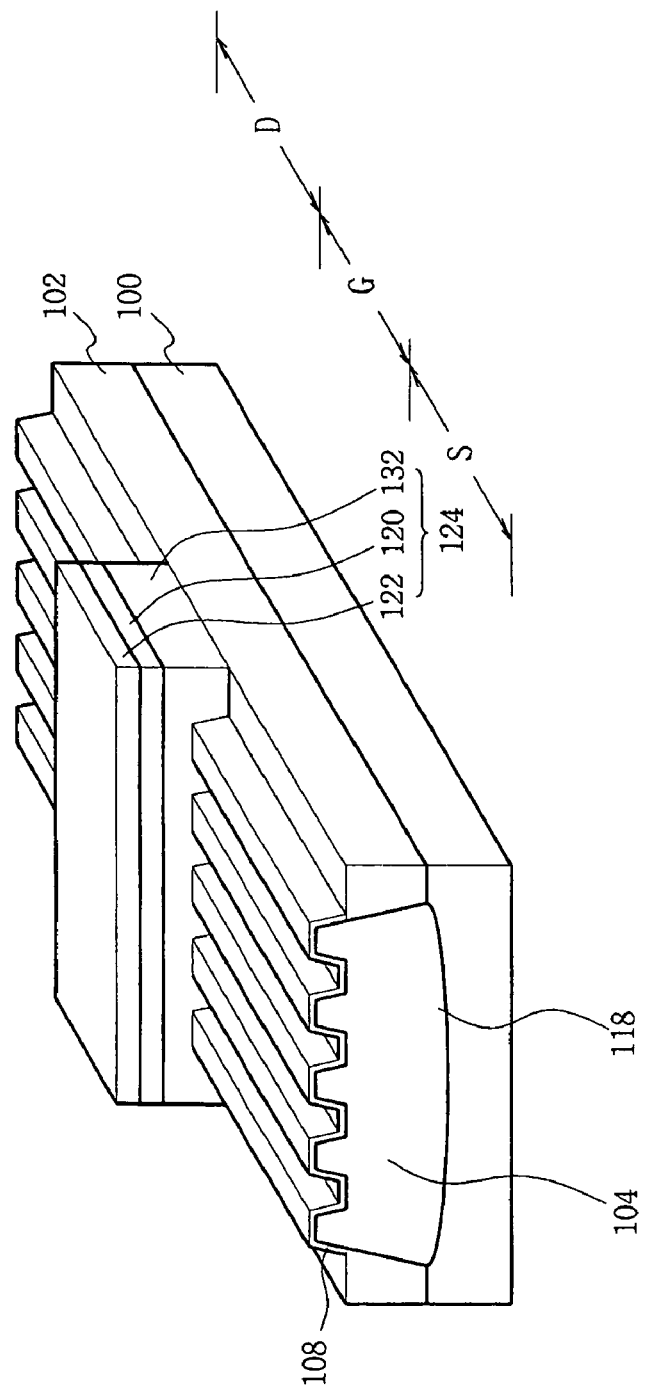

With reference now to FIG. 4m, portions of gate upper insulation layer 122, conductive metal layer 120 and gate electrode 132 covering the source (S) and drain (D) regions of active region 104 are sequentially removed using one or more dry etching process(es) and the third photoresist as an etch mask, thereby forming a gate stack 124 covering gate region (G). Thereafter, the residual portion of the third photoresist is removed.

Thus, gate electrode 132 which is initially formed over the entire surface of first trench structure 106 can readily be patterned and selectively removed in the foregoing process steps using dry etching. Because the sidewalls of first trench structure 106 are sloped the selectively to-be-removed portions of gate electrode 132 can be easily removed in comparison with the conventional approach. As a result, the resulting FET exhibits greater reliability.

Figure 4N:
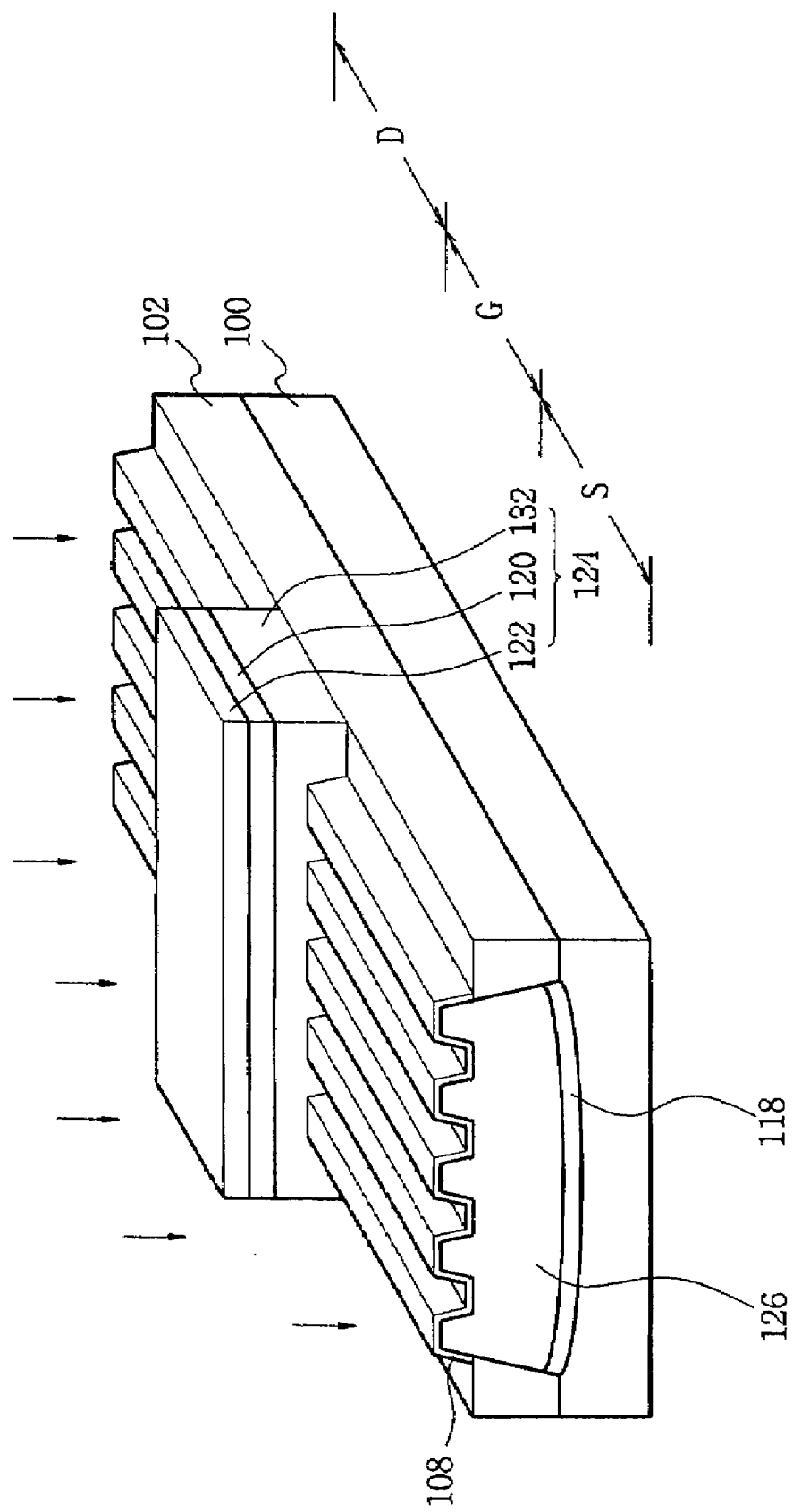

Referring now to FIG. 4n, a second conductivity type impurity opposite to the first conductivity type is ion implanted using gate stack 124 as an ion implantation mask, thereby forming a first impurity region 126 in the source(S) and drain (D) regions. In one embodiment, a lightly doped N-type impurity (e.g., phosphorus or As) is ion implanted in the source and drain regions by using the gate stack 124 as an ion implantation mask, thereby forming first impurity region 126 having a low concentration of impurities ranging from about $1.0 \times 10^{13}$ atoms/cm$^2$ to about $1.0 \times 10^{14}$ atoms/cm$^2$. One process adapted to the ion implantation of the N-type impurity is performed at an energy of about 20 KeV, such that the first impurity region 126 is formed with a depth of about 1000 Å from the surface of the semiconductor substrate 100, thereby forming a shallow junction.

Figure 4O:
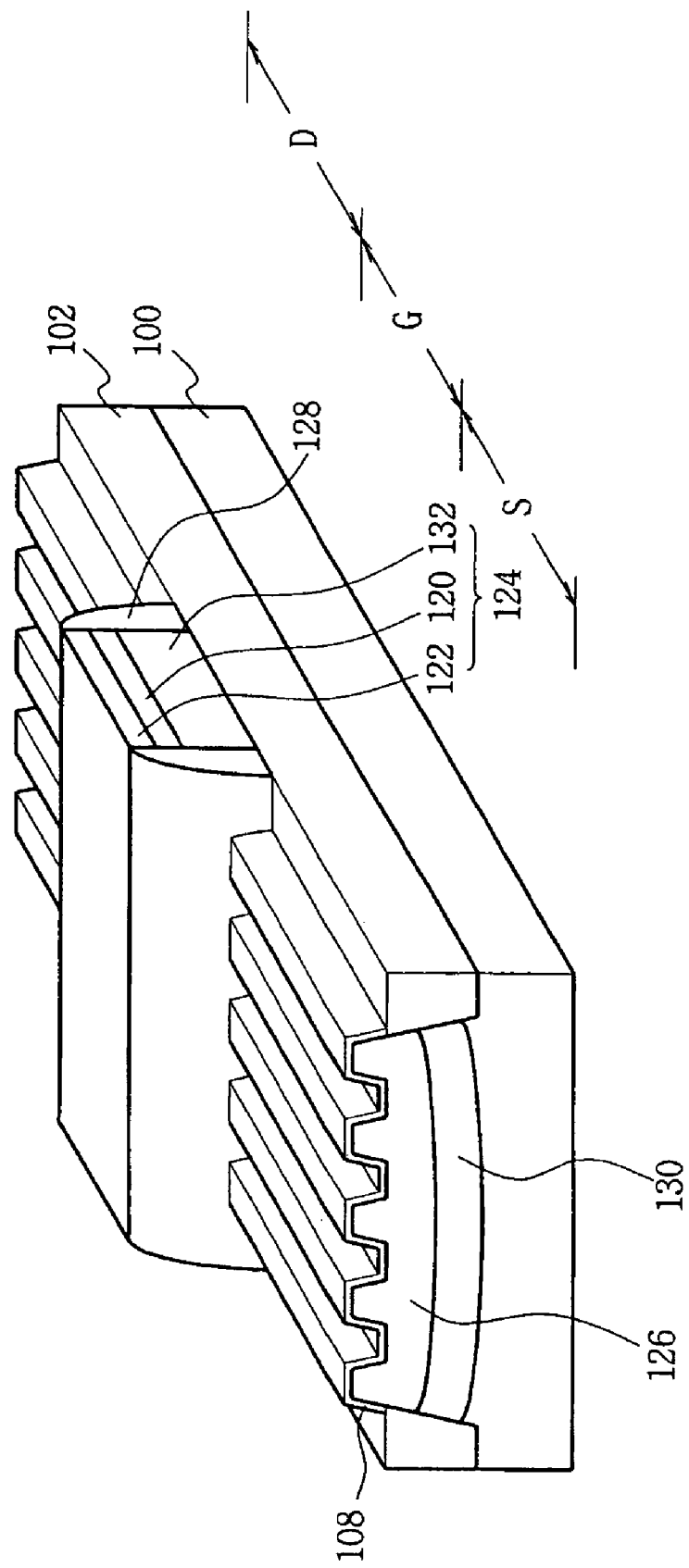

As shown in FIG. 4o, a silicon nitride layer is formed with a predetermined thickness on the resulting structure including gate stack 124 following formation of the first impurity region 126. The silicon nitride layer is thereafter anisotropically etched using a dry etching process to form spacers 128 covering the sidewalls of gate stack 124.

Figure 4P:
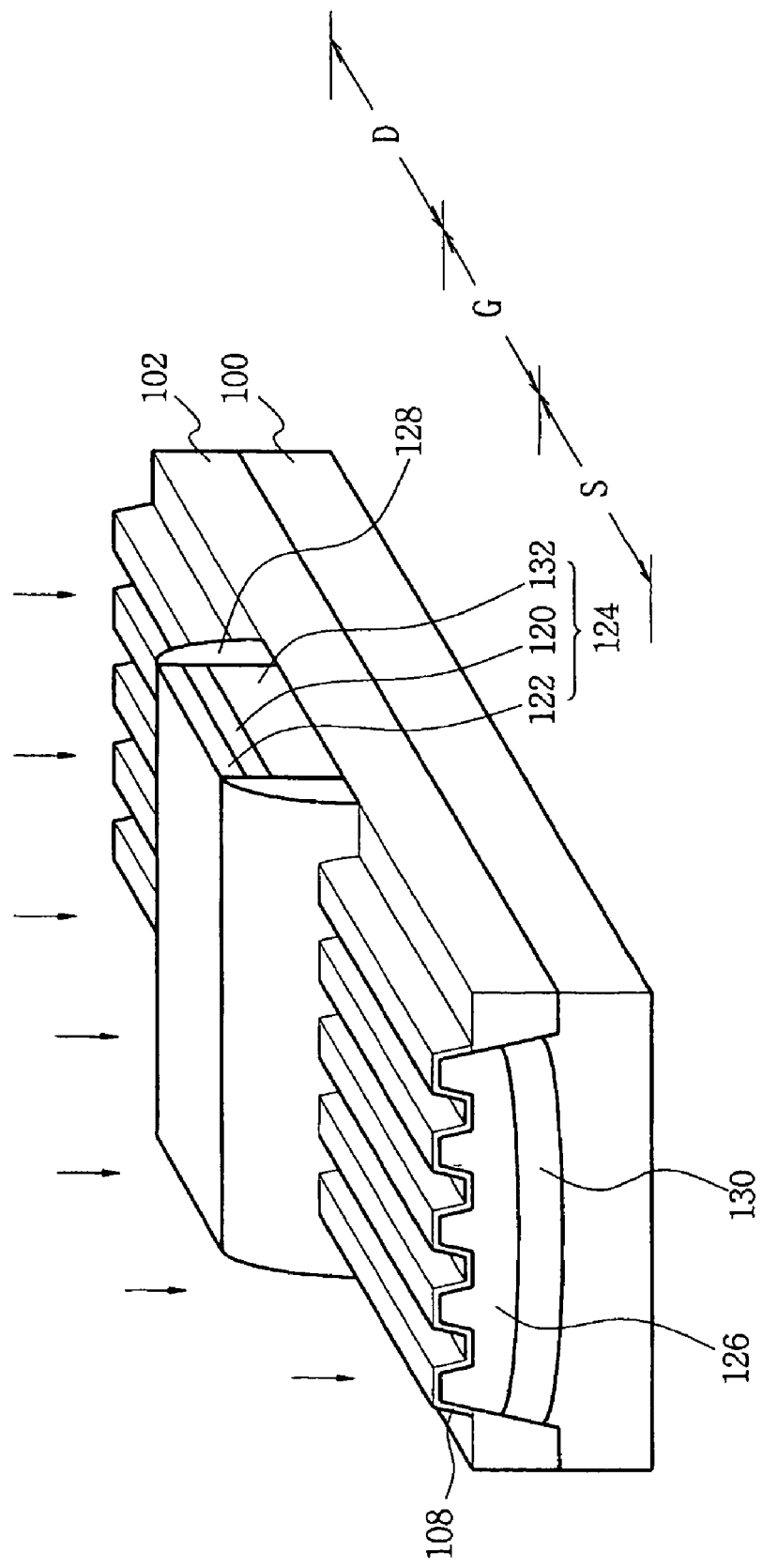

With reference to FIG. 4p, another concentration of the second conductivity type impurity is ion implanted using spacers 128 and the gate stack 124 as an ion implantation mask, thereby forming a second impurity region 130 in the source and drain regions of active region 104. Again, an N-type impurity (e.g., phosphorus or As) is preferred here, but with a higher concentration dose ranging from about $1.0 \times 10^{16}$ atoms/cm$^2$ to about $1.0 \times 10^{17}$ atoms/cm$^2$. This ion implantation process of the second concentration of N-type impurity may be performed at an energy of about 50 KeV so as to form the second impurity region 130 to a depth of about 2000 Å from the surface of active region 104 thereby forming a deep junction.

Figure 4Q:
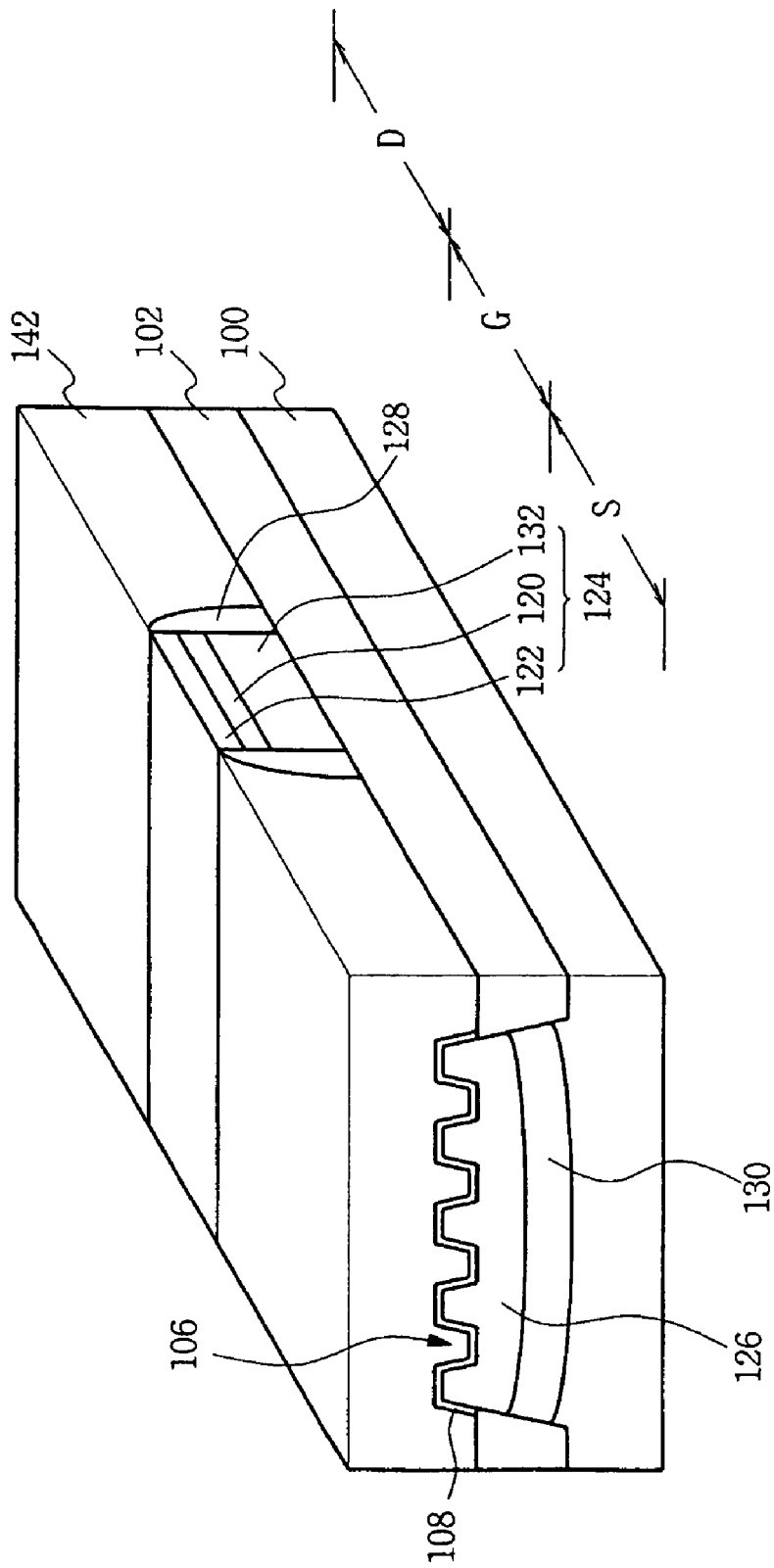

As shown in FIG. 4q, a polysilicon layer doped with a conductive impurity is then formed over the resulting structure, including the doped source and drain regions. The doped polysilicon layer is then planarly removed using, for example, a chemical mechanical polishing technique to form a pad polysilicon layer 142.

Accordingly, in a FET manufacturing method according to an exemplary embodiment, a first trench having an embossing profile is formed in an active region, and a bottom of the first trench can be used as a channel, thereby improving performance of devices.

The exemplary FET manufacturing method described above has at least the following advantages:

First, an improved first trench structure is formed in an active region so as to have an embossing profile, well adapted to the reproducible formation of a polysilicon layer filling and covering bottom corner flutes portions of the first trench structure.

Second, portions of the polysilicon layer formed over the first trench structure and covering the source and drain regions may be readily and completely removed using a dry etching.

Third, as a result of the two foregoing advantages, the bottom face portions of the first trench structure effectively form portions of the gate channel.

Each of the foregoing advantages results in greater device reliability.

It will be apparent to those skilled in the art that modifications and variations can be made to the foregoing exemplary embodiments. The embodiments described above are examples and are intended to teach the making and use of the present invention. Many modifications and variations will fall within the scope of the invention as defined by the appended claims and their equivalents.

What is claimed is:

1. A method of manufacturing a field effect transistor (FET), the method comprising:

forming a first trench structure in an active region of a semiconductor substrate;

forming a second trench structure to laterally define the active region;

forming a shallow trench insulator within the first trench structure and the second trench structure;

removing the shallow trench insulator from the first trench structure and a portion of the shallow trench insulator from the second trench structure to expose the first trench structure;

forming a gate insulation layer on a portion of the active region such that downward outer edges of the gate insulation layer make contact with a portion of the shallow trench insulator remaining within the second trench structure and the gate insulation layer is not formed on edge portions of the active region;

forming a gate electrode structure on the gate insulation layer; and ion implanting an impurity of first conductivity type in source and drain regions of the active region using the gate electrode structure as an ion implantation mask to thereby form a first impurity region.

2. The method of claim 1, wherein the forming of the first trench structure comprises:

sequentially forming a pad oxide layer and a hard mask layer on the semiconductor substrate;

patterning the hard mask layer and the pad oxide layer using a photolithography process; and selectively removing to a predetermined depth portions of the semiconductor substrate using the hard mask layer and the pad oxide layer as an etch mask to thereby form a plurality of trenches.

3. The method of claim 2, wherein the pad oxide layer is formed using a thermal oxidation or chemical vapor deposition (CVD) process.

4. The method of claim 2, wherein the hard mask layer is formed of silicon nitride.

5. The method of claim 2, wherein the pad oxide layer is patterned by using a CF4 reactive gas.

6. The method of claim 5, wherein the pad oxide layer is patterned at a pressure of about 30 mTorr and with an energy of about 400 W.

7. The method of claim 2, wherein the portions of the semiconductor substrate are selectively removed using a dry etching process with reactive gases comprising HBr, $Cl_2$ or $HeO_2$.

8. The method of claim 7, wherein the reactive gases comprises HBr, $Cl_2$ and $HeO_2$ flowing at rates of about 90:10:12 respectively.

9. The method of claim 7, wherein the dry etching process is performed at a pressure of about 0.1 mTorr and with an energy of about 300 W.

10. The method of claim 7, wherein the dry etching process is performed at a temperature ranging from about 87° to about 40°.

11. The method of claim 2, wherein the predetermined depth is less than about 1000 Å.

12. The method of claim 2, wherein the hard mask layer and the pad oxide layer are removed after formation of the shallow trench insulator.

13. The method of claim 1, wherein the second trench structure is formed to a depth of greater than about 2000 Å.

14. The method of claim 1, wherein the second trench is formed using a dry etching process with reactive gases comprising $CF_4$ and $0_2$.

15. The method of claim 14, wherein the reactive gases comprise $CF_4$ and $0_2$ flowing at rates of about 60:150 respectively.

16. The method of claim 1, wherein the first trench structure is formed in the active region after formation of the second trench structure and formation of the shallow trench insulator.

17. The method of claim 1, wherein forming the shallow trench insulator comprises:

forming a silicon oxide layer over the first and second trench structures to form the shallow trench insulator, and removing a portion of the shallow trench insulator formed the first trench structure.

18. The method of claim 1, further comprising:

forming a channel impurity region by ion implanting a impurity of second conductivity type into the active region.

19. The method of claim 18, wherein the channel impurity region is formed using ion implanting process performed at an energy ranging form about 30 KeV to about 50 KeV, such that the density of the impurity of second conductivity type ranges from about $1.0 \times 10^{13}$ atoms/cm² to about $1.0 \times 10^{15}$ atoms/cm².

20. The method of claim 1, wherein the gate insulation layer is formed from a silicon oxide layer.

21. The method of claim 20, wherein the silicon oxide layer is formed using a rapid temperature oxide (RTO) process.

* * * * *